United States Patent
Lee et al.

(10) Patent No.: US 6,403,406 B2
(45) Date of Patent: Jun. 11, 2002

(54) METHOD FOR FORMING A TFT IN A LIQUID CRYSTAL DISPLAY

(75) Inventors: Joo-Hyung Lee, Seoul; Mun-Pyo Hong, Kyunggi-do; Chan-Joo Youn, Seoul; Byung-Hoo Jung; Chang-Won Hwang, both of Kyunggi-do, all of (KR)

(73) Assignee: Samsung Electronics Co., Ltd, Suwon (KR)

( * ) Notice: Subject to any disclaimer, the term of this patent is extended or adjusted under 35 U.S.C. 154(b) by 0 days.

(21) Appl. No.: 09/793,541

(22) Filed: Feb. 27, 2001

Related U.S. Application Data

(62) Division of application No. 09/323,030, filed on Jun. 1, 1999, now Pat. No. 6,225,150.

(30) Foreign Application Priority Data

| | | |
|---|---|---|
| May 29, 1998 | (KR) | 98-19760 |
| Nov. 12, 1998 | (KR) | 98-48365 |
| Dec. 8, 1998 | (KR) | 98-53796 |

(51) Int. Cl.[7] .................... H01L 21/00; H01L 21/84
(52) U.S. Cl. ................................. 438/153; 438/266
(58) Field of Search .................. 438/30, 149, 151, 438/153, 163, 166, 266, 287, 308, 381, 463, 487, 486, 514, 206, 949

(56) References Cited

U.S. PATENT DOCUMENTS

| 5,644,146 A | * 7/1997 | Arai et al. ..................... 257/66 |
| 5,818,070 A | * 10/1998 | Yamazaki et al. ............. 257/72 |
| 5,965,904 A | * 10/1999 | Ohtani et al. .................. 257/55 |

* cited by examiner

*Primary Examiner*—Viet Q. Nguyen
*Assistant Examiner*—David Nhu
(74) *Attorney, Agent, or Firm*—McGuireWoods LLP

(57) ABSTRACT

A double level gate layer with an undercut lower gate layer can be formed by using the etching rate difference between the upper gate layer and the lower gate layer in a polycrystalline Si type TFT LCD that has P-channel TFTs and N-channel TFTs. An LDD structure can be easily formed by using an upper gate layer as ion implant mask during the N-type ion implantation. LDD size is decided by the skew size between the upper gate layer and the lower gate layer. Furthermore, a photolithography step necessary for masking the ion implantation can be skipped.

9 Claims, 18 Drawing Sheets

METHOD FOR FORMING A TFT IN A LIQUID CRYSTAL DISPLAY

This application is a Divisional of Ser. No. 09/323,030 filed Jun. 1, 1999, now U.S. Pat. No. 6,225,150.

BACKGROUND OF THE INVENTION

1. Field of Invention

This invention is generally related to a process for fabricating a Thin Film Transistor (TFT) in a Liquid Crystal Display (LCD). Especially, this invention is related to a TFT composed of polycrystalline silicon and having an off-set area or a lightly doped drain (LDD) structure.

2. Description of Related Art

An LCD is comprised of two substrates with liquid crystals interjected therebetween. An LCD is controlled by applying voltages to electrodes formed on the inside surface of substrates. It displays images by controlling the transmission and interception of lights, taking advantage of the relationship between the alignment of the liquid crystal layer and a polarizor. The liquid crystal layer's alignment is controlled by the electric field applied through the TFT. An LCD employs a retardation film, a reflecting plate and color filters for its image display. A lot of efforts are devoted for a better LCD in improving a polarizer, an alignment layer, an electrode composition, a glass substrate and a rubbing technique.

A pixel circuit, a display unit of LCD, is controlled by a transistor made of a semiconductor thin film on a glass substrate. TFT LCDs can be categorized into two types by characteristics of the semiconductor thin film. One type is an amorphous Si type TFT and the other is a polycrystalline Si type TFT. Amorphous Si type TFT has advantages that it can be formed at a low temperature, while having disadvantages that it has a lower carrier mobility. Usually, an amorphous Si type TFT is used for a switch transistor of a pixel circuit. This means that a driver circuit, which needs a higher carrier mobility, should be fabricated in a separate polycrystalline silicon process, resulting in a cost increase.

Polycrystalline Si has a high carrier mobility necessary for a driver circuit, so it can be used for both a driver circuit and a pixel circuit if a high temperature in fabricating a polycrystalline Si layer is not a problem. A polycrystalline Si structure would decrease the power consumption and the manufacturing costs. However, polycrystalline Si layer requires an additional step of the laser annealing of an amorphous Si layer and may not maintain a sufficient electric field in the pixel region because the high carrier mobility renders an excessive off current flow when the TFT is turned off.

FIG. 1 shows a vertical section of a conventional thin film transistor. An insulation layer (100) as a buffer layer lies on the substrate (10). An active area (200) formed of a semiconductor film lies on the insulation layer and a gate insulation layer (300) lies on the active area. Gate (410) lies on the gate isolation layer over the center of the active area. Source area and drain area (211, 213) are formed in an active area using the gate as implantation mask.

Current flows from source to drain when the transistor is turned on, and the display signal is applied to a pixel circuit connected to the drain. However, in a polycrystalline Si TFT, once the transistor is turned off, display signals can not be maintained in the pixel because a lot of off-currents are flowing when the transistor is turned off due to the high carrier mobility of polycrystalline Si. Usually an LDD (Lightly Doped Drain) or an off-set area that is not doped are used as a barrier structure between channel and source (or drain) to suppress the off-current.

The challenges in manufacturing a polycrystalline Si type LCD having a driver circuit and a pixel circuit on the same glass substrate are how to form a barrier structure in an N-channel TFT; how to mask the P,N ion implantation; and how to minimize the process steps.

In order to form a barrier structure, a conventionally used ion implantation mask is a photo resist pattern, a spacer around the gate, or an oxidized gate metal edge. However, a photoresist pattern as an ion implantation mask renders aligning difficulties, and is not cost effective. Also a photo resist pattern may not stand out the heat generated during the high energy ion implantation. A spacer requires an extra deposition and an etch-back of CVD (Chemical Vapor Deposition) layer. Using an oxidized gate metal edge requires an additional mask in order to prevent other areas from oxidation. Also, the device may be partially damaged during the anisotropic dry etching and extra oxidation process.

SUMMARY OF THE INVENTION

An object of the present invention is to provide an improved process for forming an LDD or an off-set area in a polycrystalline Si type TFT. Another object of the present invention is to provide an improved process with minimum steps for forming an LDD or an off-set area in the polycrystalline Si type TFT.

The foregoing objects and other advantages of the invention are achieved, in the first aspect, by an LDD or an off-set structure that prevents the off-current while reducing the number of photolithography steps. In accordance with that aspect, a Si layer is laid on a glass substrate. An active area is formed by patterning the Si layer and a gate insulation layer is formed over the active area. Upper gate film and lower gate film are laid on the gate insulation layer and patterned to form a gate pattern of which lower gate pattern is narrower than the upper gate pattern. Source and drain regions, are ion-implanted using upper gate pattern as an implantation mask and then upper gate pattern is removed.

The off-set area is an active area that is not implanted during the iron-implantation and is defined by the size of skew that is a width difference between the upper gate pattern and the lower gate pattern. The size of the off-set area is usually limited because of the increased resistivity. An LDD is formed by a low dose implantation after removing upper gate layer. The LDD functions as a barrier structure against the off-current and also prevents the off-set area's high resistivity problem. The gate pattern can be undercut at the lower gate pattern by using a wet etchant having a high selectivity against the lower gate material. The etching step can be divided into two steps for each gate material to obtain a more accurate skew control. The etchant speed must be controlled in order to form a adequately skewed undercut in the lower gate pattern.

The foregoing objects and other advantages of the invention are further achieved in the second aspect of the present invention that prevents the off-current and provides a well activated doped area. In accordance with the second aspect, a polycrystalline Si active area is formed and patterned on a glass substrate. The following steps of forming an insulation layer on the active area, forming a lower gate layer and an upper gate layer on the insulation area, forming an upper gate pattern and an undercut lower gate pattern at the center of active area, are similar to the first aspect of the present invention. But, in the ion implantation, the low density ions are implanted first using the upper gate pattern as implant mask. Then, we form a photoresist pattern that is wider than the upper gate pattern and implant high density ions using the photoresist pattern over source and drain as implantation mask. After removing the photoresist pattern and the upper gate pattern, the ion implanted area is activated by laser annealing.

The foregoing objects and other advantages of the invention are also achieved in the third aspect by forming a polycrystalline Si type N-channel and P-channel TFT on the same glass substrate. In accordance with the third aspect, a Si layer is laid on a glass substrate. An active area is formed by patterning the Si layer. A gate insulation layer is laid on the active area and a lower gate layer is formed on the gate insulation layer. The lower gate layer is patterned leaving N-channel TFT area and P-channel gate area, then P-type impurity is implanted using the lower gate pattern as implantation mask. Upper gate layer is deposited and etched using a photo mask, leaving P-channel TFT area and N-channel gate area, and then the lower gate layer is etched using the upper gate layer as etch mask in N-channel TFT area, after which N-type impurity is implanted. The upper gate pattern is removed after ion implantation.

An LDD is formed in this embodiment if a low energy N-type implantation step is added and the etchant for the gate layer has a high selectivity against the lower gate material. In accordance with the third aspect, the off-set structure of N-channel transistor is formed by a self aligning method. This may decrease the photolithography steps and align the pattern easily. Furthermore, an extra implantation mask is not necessary.

Protecting P-channel and N-channel transistor while implanting N-type or P-type impurities without an additional step and without damaging a photoresist layer is an important issue. The third aspect of the present invention provides a protection mechanism against ion implantation without an additional step and without damaging photoresist layers.

DETAILED DESCRIPTION

Figure 1:
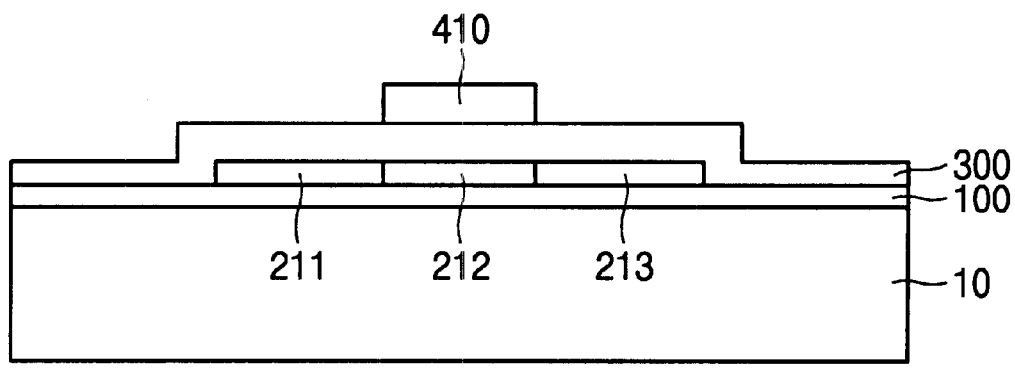
FIG. 1 shows a vertical section of a conventional thin film transistor.

Referring to FIGS. 2a through 2h, more details are explained on the first embodiment, a polycrystalline Si type TFT having an off-set area. First, an isolation buffer layer (100) of SiO$_2$ is formed about 3,000 Å thick on a transparent glass substrate (10) in FIG. 2a. Then an amorphous Si layer of 500~800 Å (200) is laid on the isolation buffer layer in FIG. 2b. The amorphous Si (200) is poly-crystalized by laser annealing and patterned to form an active area (210) in FIG. 2c. A SiO$_2$ isolation film of 1,000 Å thickness is deposited to form a gate insulation layer (300) in FIG. 2d. On the gate insulation layer, lower gate layer (400) and upper gate layer (40) respectively of 2,000~3000 Å thickness are deposited. Gate layers can be formed of high selectivity materials like Al/Cr, Cr/Al and Cr/ITO or low selectivity materials, such as Al/Mo, Mo/Al and Mo/ITO that have a low selectivity against Al etchant and ITO etchant in FIG. 2e.

After laying photoresist film on the gate layer, a photoresist pattern (520) is patterned for wet etching the upper gate layer (40) and the lower gate layer (400) to form a gate electrode (410, 41) having an upper gate pattern and an undercut lower gate pattern. When the upper gate layer and the lower gate layer are composed of metals with a high etching selectivity, upper gate pattern (41) is formed first by etchant having a high etching ratio against the upper gate layer using the photoresist pattern as etch mask, and the lower gate pattern (410) is formed by another etchant having a high etching ratio against the lower gate layer and a low etching ratio against the upper gate layer using the upper gate pattern as etch mask. Commercially available etchants usually composed of phosphoric acid, nitric acid and acetic acid can be used for Al layers. For Cr layers, can be used also commercially available etchants composed of nitric acid and ceric ammonium nitride (C.A.N).

Figure 2A:
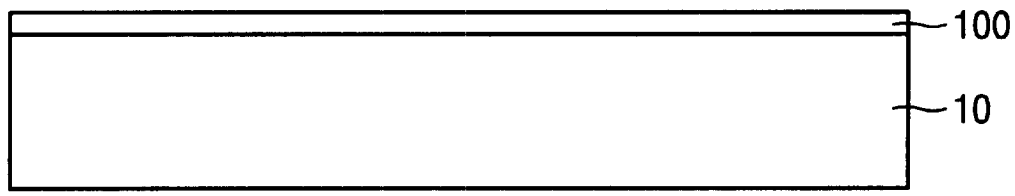
FIGS. 2a through 2h illustrate process sequences of a first embodiment of the present invention.
Figure 2B:
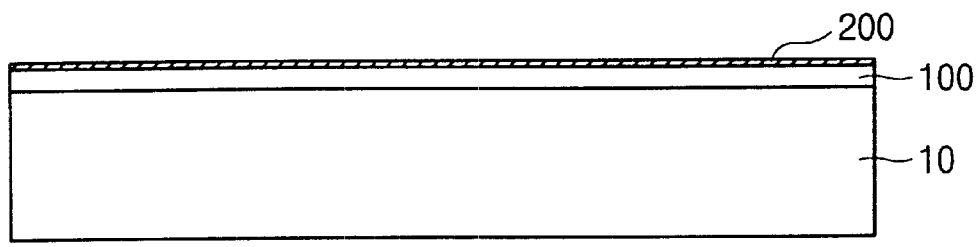
Figure 2C:
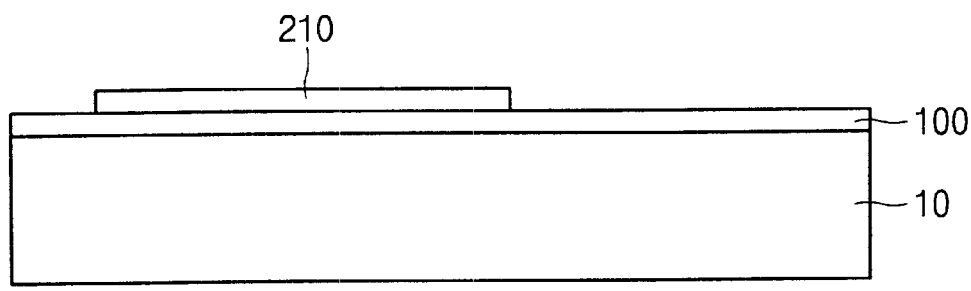
Figure 2D:
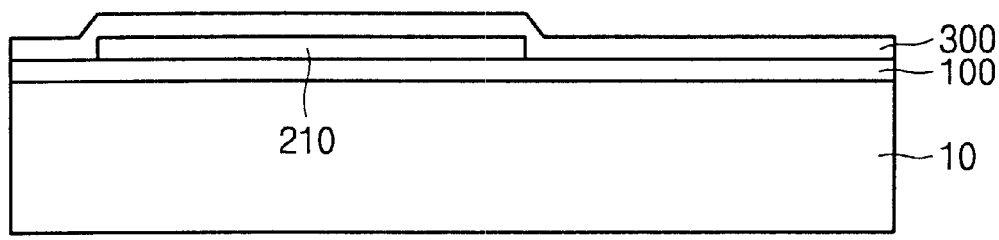
Figure 2E:
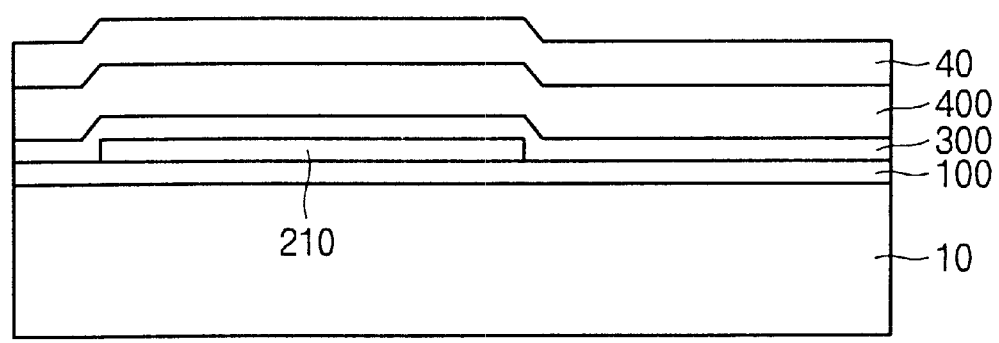
Figure 2F:
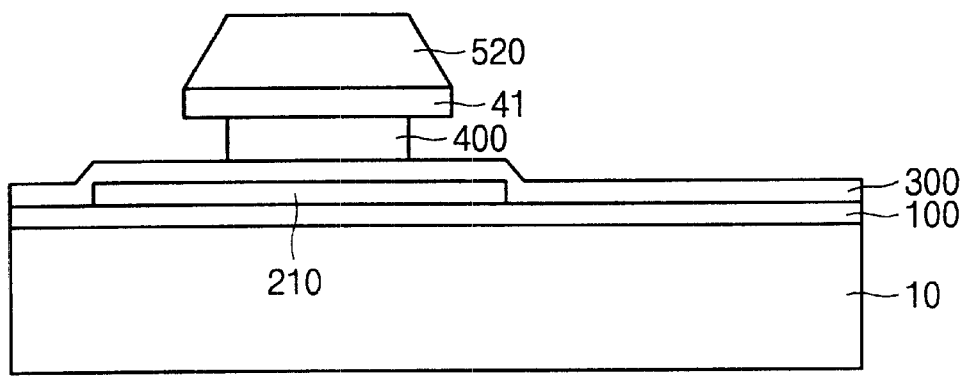
Figure 2G:
Figure 2G:
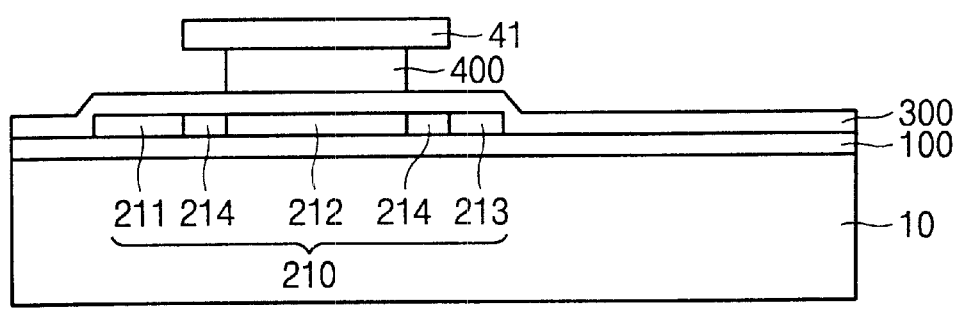

When using a material having a very low selectivity ratio against Al etchant, which is a solution of phosphoric acid, nitric acid and acetic acid for both gate layers, both of the gate layers can be etched by using an etchant that can etch both gate materials in a spray and a dipping method. After the upper gate etching is almost finished, the lower gate layer starts to be etched and the isotropic etching forms an undercut. As an example, suppose that the upper gate layer is Mo and the lower gate layer is Al. When the upper gate layer Mo is almost etched out and the lower gate layer Al is exposed to the etchant, the lower gate layer Al is more rapidly etched out than Mo, forming an undercut, because Al is electrolyzed by the electromotive force. The size of the undercut can be controlled by the over-etching time the composition of etchant and the etching type as shown in FIG. 2f.

Figure 2H:
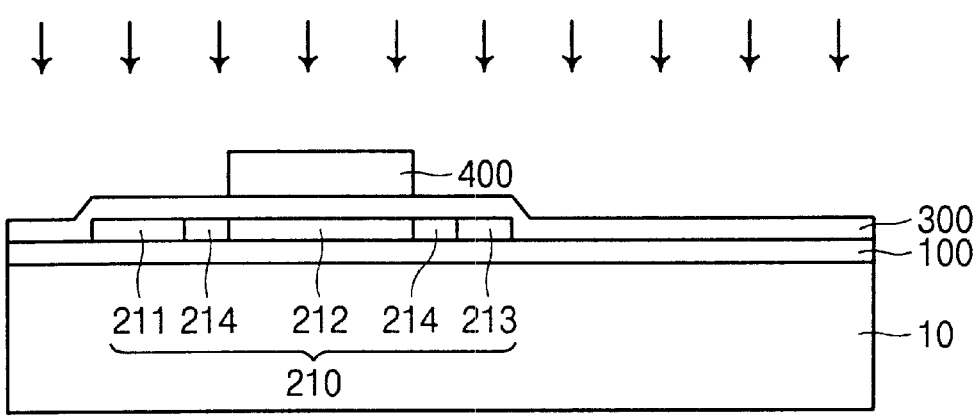

The process continues with an ion implantation after the photo resist pattern (520) is removed. The active area outside of the upper gate pattern (41) is ion-implanted, using the upper gate pattern as implantation mask. Off-set area (214) is an active area that is not implanted but outside of the lower gate pattern (410) in FIG. 2g. If needed, an LDD (214) can be formed in the off-set area by low-energy implantation using the lower gate pattern (410) as implantation mask as shown in FIG. 2h.

Now it is described how to form an N-channel transistor in the pixel circuit, and an N-channel transistor as well as a P-channel transistor in the driving circuit at the same time on the glass substrate.

Figure 3A:
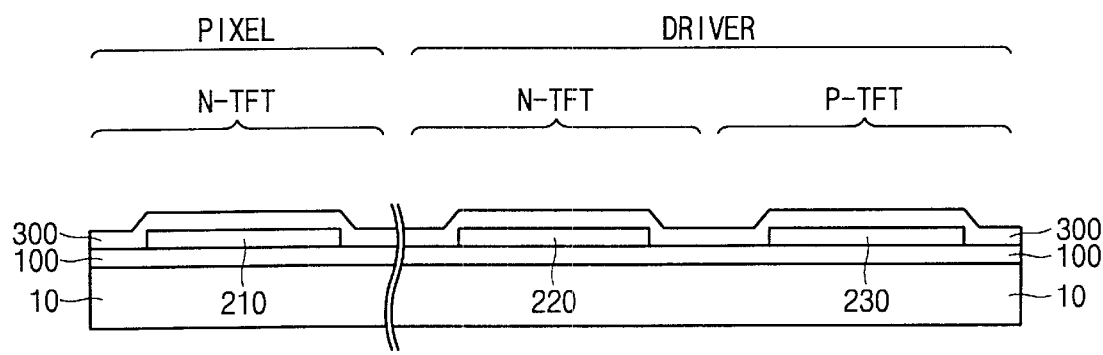
FIGS. 3a through 3j illustrate process sequences of a second embodiment of the present invention.
Figure 3B:
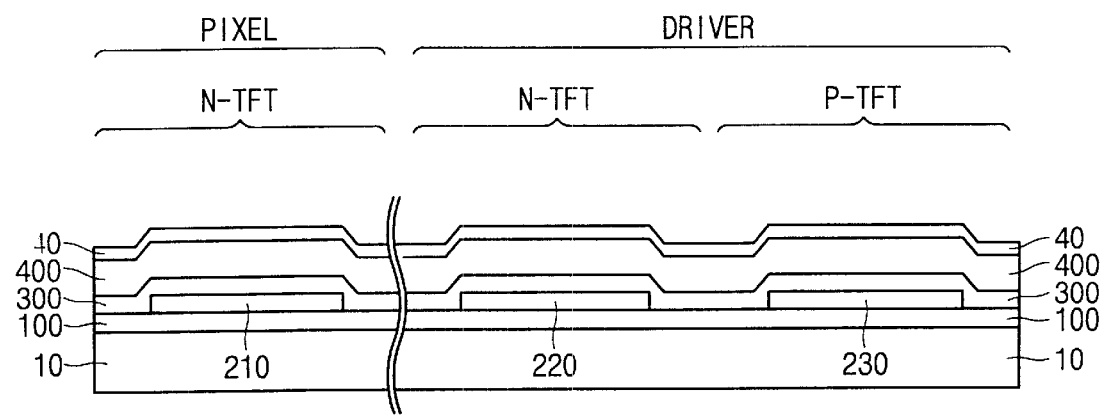
Figure 3C:
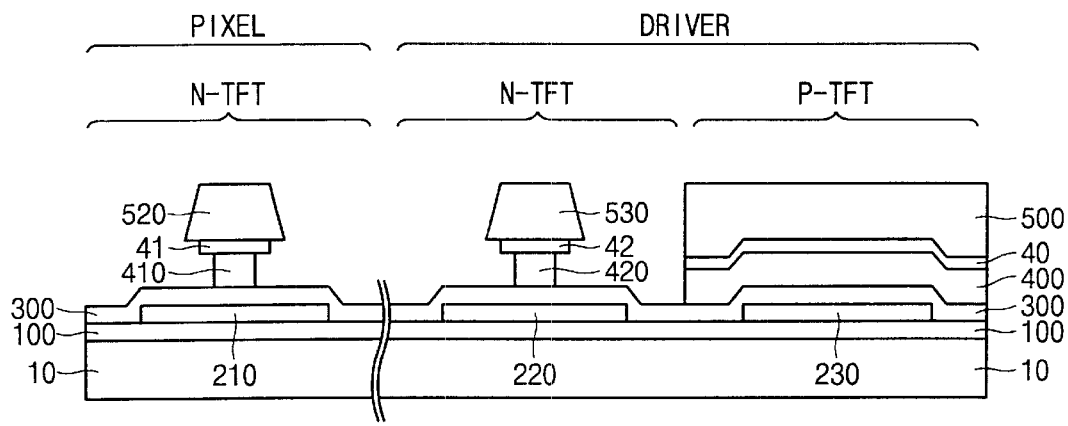

FIGS. 3a~3j show the cross-section of TFT areas according to the TFT formation sequence. First buffer layer (100) is formed by deposition of SiO$_2$ on a glass substrate (10). Then, polycrystalline Si active areas (210, 220, 230) that will be an N-channel TFT of the pixel circuit, an N-channel TFT and a P-channel TFT of the driver circuit are formed. This active area is formed on a buffer layer (100) by depositing low temperature CVD amorphous silicon, then poly-crystallizing it by laser annealing and patterning it by a photolithography step. The process continues with a formation of a gate insulation layer (300) made of SiO$_2$ as shown in FIG. 3a and the lower gate layer (400) and the upper gate layer (40) are deposited as shown in FIG. 3b. The lower gate layer (400) must be formed of a material that has a higher etching ratio against the etchant than the upper gate layer (40). N-channel upper gate patterns (41, 42) are etched using photoresist masks (520, 530) over the gate area of the N-channel TFT as etch mask as shown in FIG. 3c. Photoresist mask (500) prevents the P-channel TFT area from being etched.

Lower gate patterns (410, 420), which have undercuts and are narrower than upper gates 41, 42, are formed below upper gate patterns because the lower gate material has a higher selectivity against the etchant. The lower gate pattern becomes a transistor gate and the upper gate pattern works as implantation mask during the source-drain implantation step. Size of the LDD or the off-set area corresponds to the skew between the upper gate pattern and the lower gate pattern. The skew is in the range of 0.2~0.8 µm for the off-set area and is in the range of 0.5~1.5 µm for the LDD. A lot of factors, such as voltages to be applied, dimension of other elements and transistor characteristics determine the actual size.

Figure 3D:
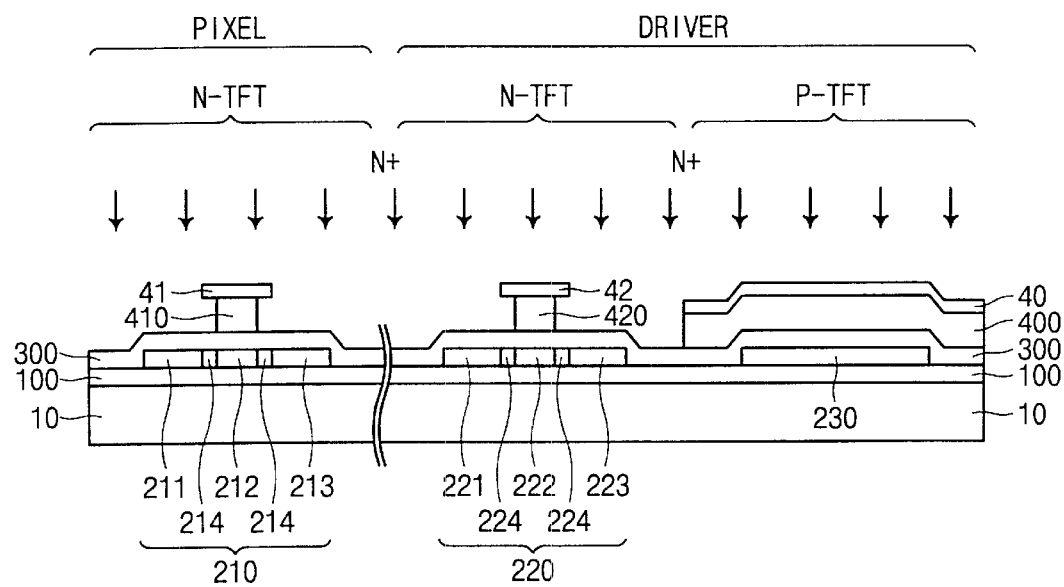
Figure 3E:
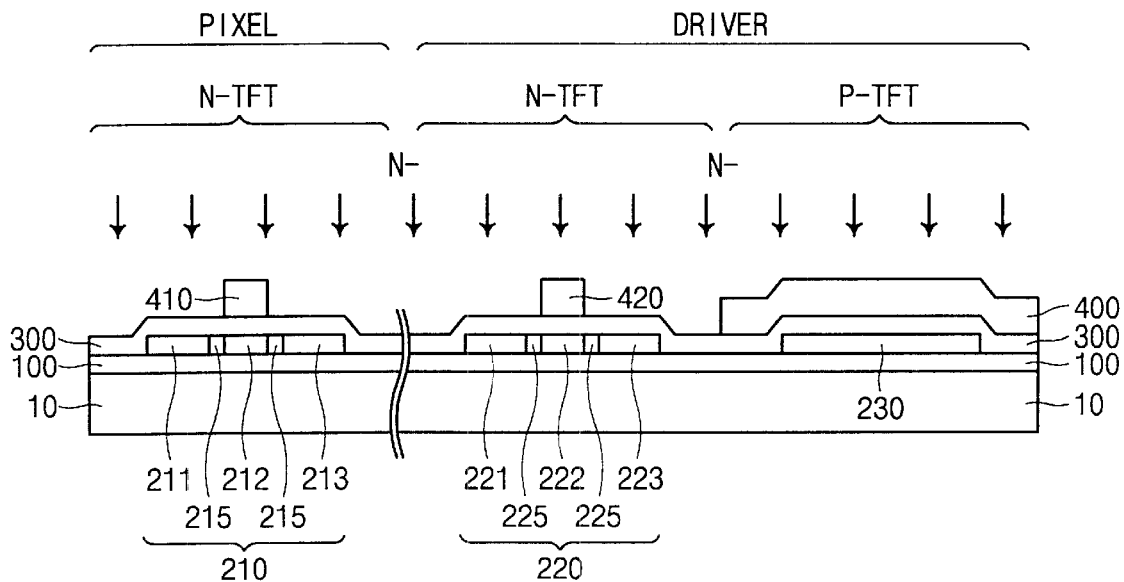

Photoresist layer (500) and photoresist patterns (520, 530) over the upper gate layer are removed after N-channel TFT gates are formed. Then, N-type impurity ions are implanted all over the glass substrate. Since upper gate patterns (41, 42) and P-channel upper gate layer (40) act as mask layer, an extra mask for P channel TFT is not needed. Source and drain (211;221, 213;223) and channels (212, 222) are formed in the N-channel TFT active area after ion implantation as shown in FIG. 3d.

The process continues with a removal of upper gate layer (40) and upper gate pattern (41, 42), and then low energy N-type impurities are implanted. LDDs (215, 225) are formed in the skew area between upper gate pattern and lower gate pattern because lower gate patterns (410,420) act as mask layer for LDD implantation. LDD can improve the off-current and the high resistivity problem of the off-set area. If the LDD ion implantation step is skipped, then an off-set area is formed instead. P-type TFT area is protected by lower gate layer (400) during the LDD ion implantation.

Figure 3F:
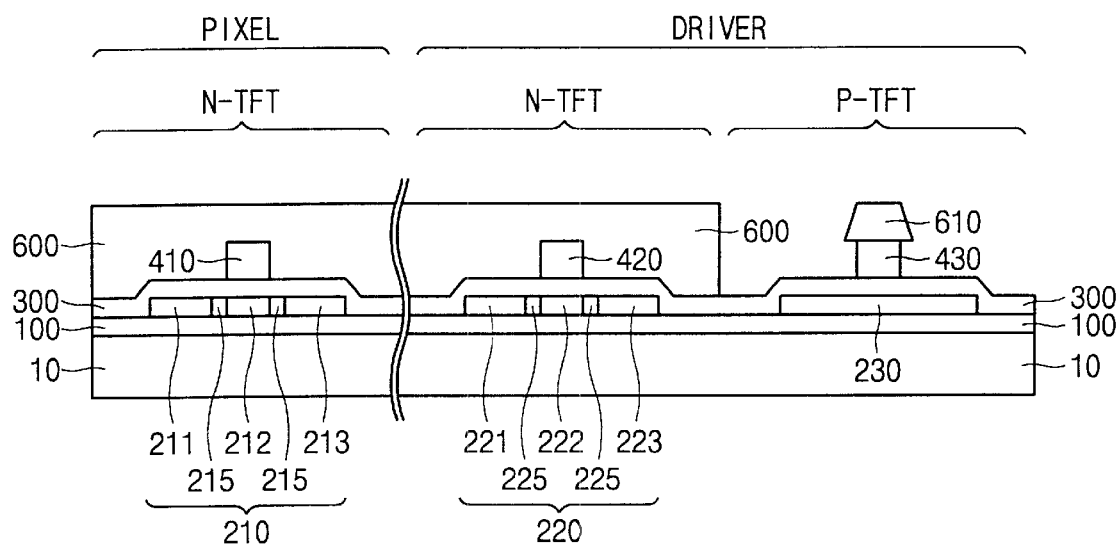
Figure 3G:
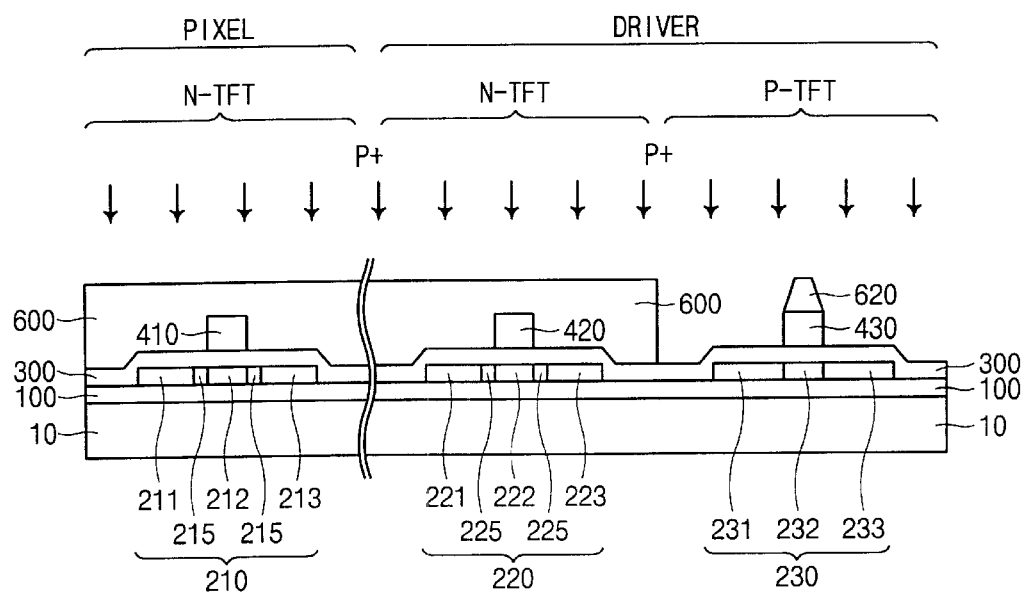

A photoresist layer is formed over N-channel transistor (600) and gate area of P-channel transistor (610) for P-channel TFT formation as shown in FIG. 3f. P-channel gate pattern (430) is etched using photoresist layers (600, 610) as etch mask and then an undercut is formed below photo resist pattern (610). Since a P-channel transistor requires neither an LDD nor an off-set area, the photoresist pattern (610) may be reduced to (620) by ashing or baking, and P-type impurities may be implanted using the lower gate patterns (430) as implantation mask. Source, drain (231, 233) and channel (232) of P-channel transistor are formed by P-type ion implantation using the lower gate pattern (430) as mask and N-channel transistor area is covered with a photoresist layer (600) during this implantation step. After the photoresist layer over N-channel transistor and the gate area of P channel transistor is removed, an isolation layer is deposited and a source electrode and a drain electrode are formed. Then, a passivation layer is laid and pixel electrodes are formed.

Figure 3H:
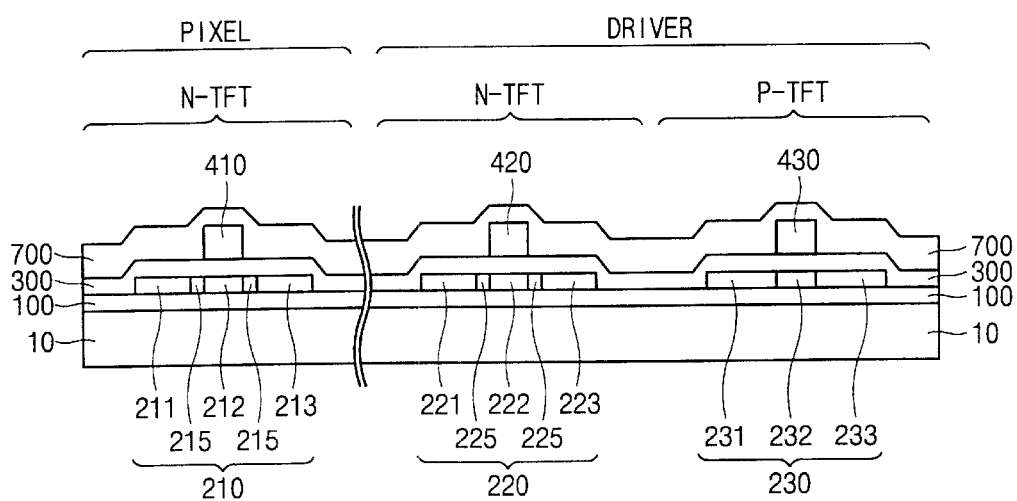
Figure 3I:
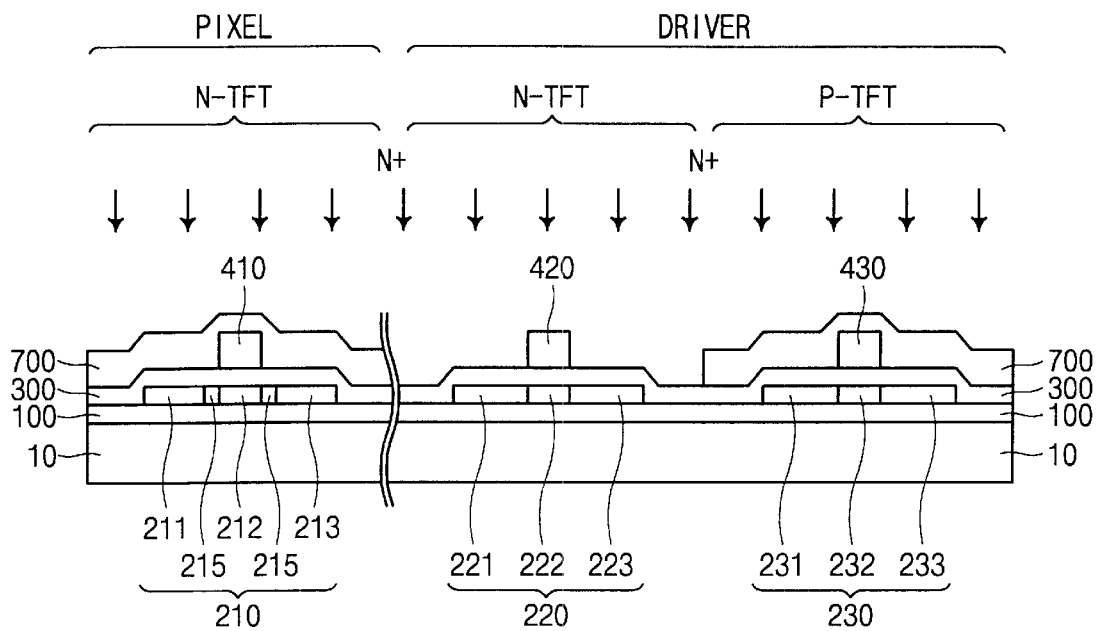
Figure 3J:
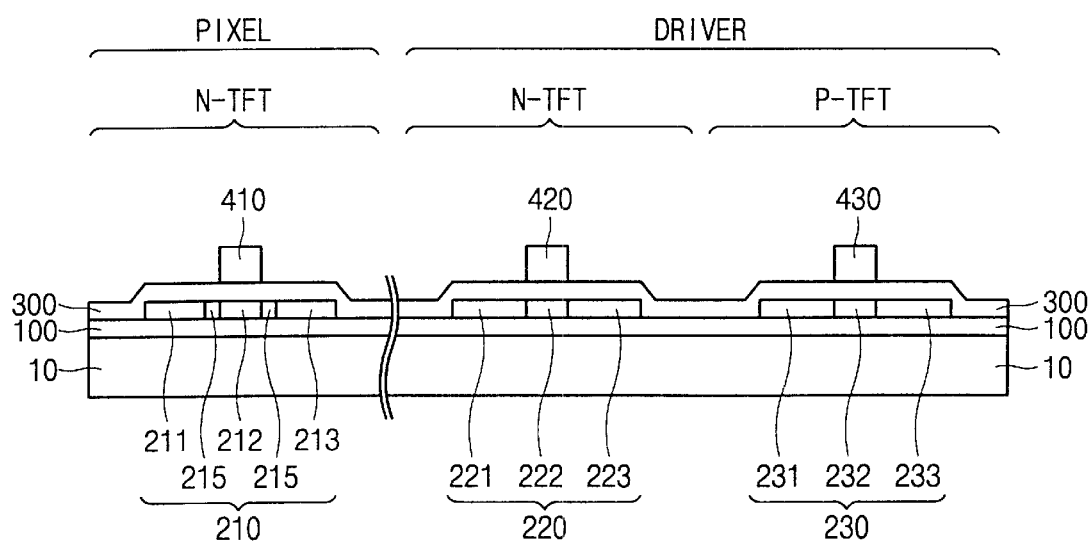

A simple source, gate and drain structure (212, 222, 232) can be formed by high energy implantation over N-channel transistor if barrier structure like an LDD and an off-set area are not needed. P-channel should be covered with a metal layer (700) or a photoresist layer during this N-type high energy implantation as shown in FIGS. 3h–3i.

Figure 4:
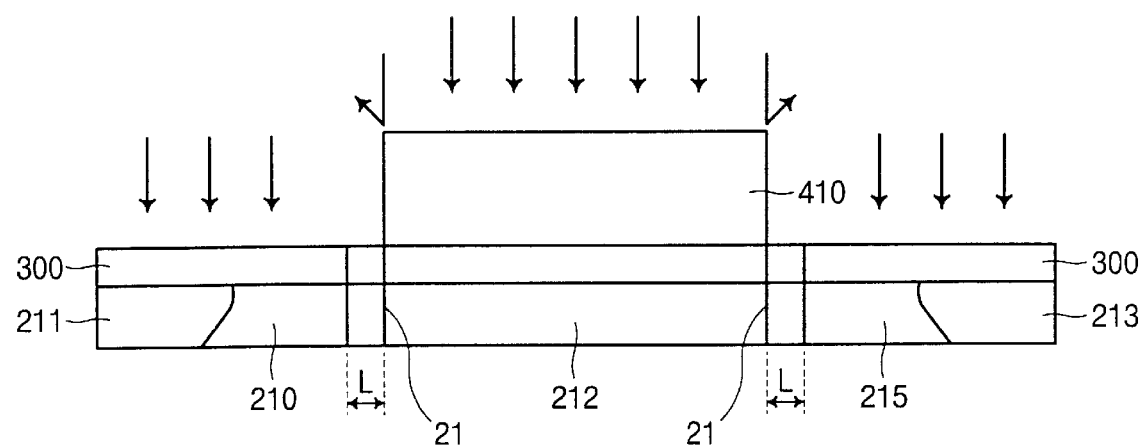
FIG. 4 illustrates the laser scattering around the gate pattern, resulting in a non activation area.
Figure 5A:
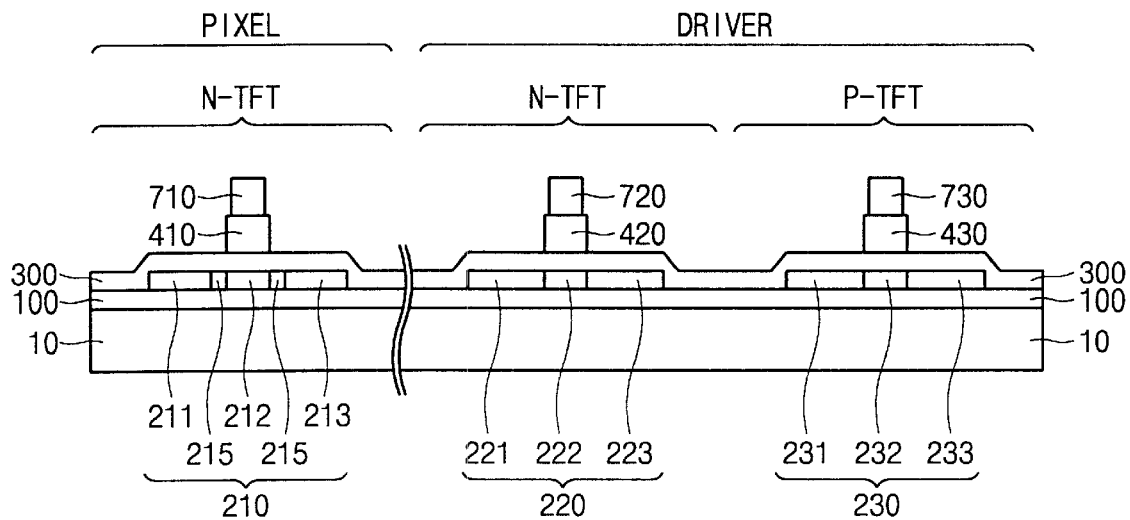
FIGS. 5a and 5b illustrate an additional process to solve the scattering problem.
Figure 5B:
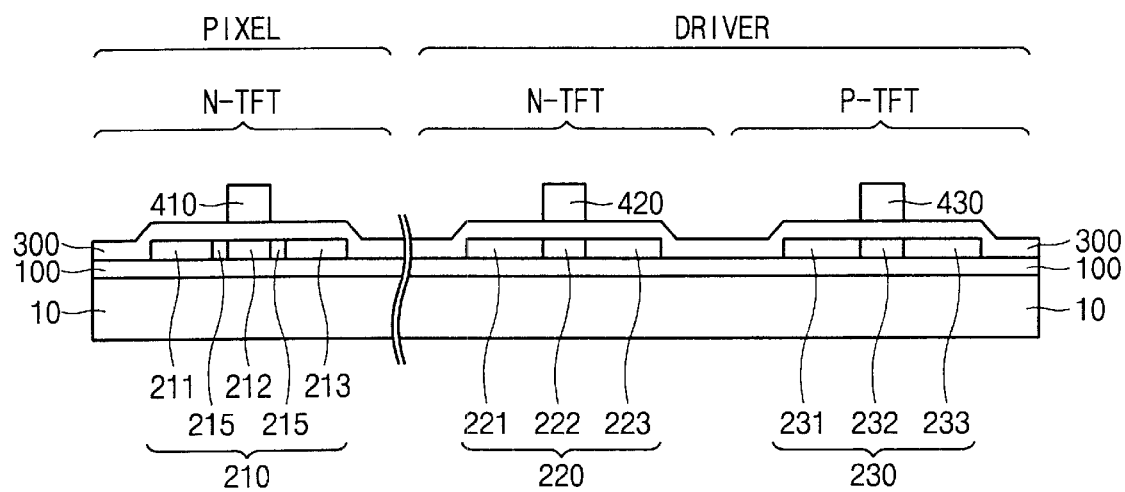

Meanwhile ion-implanted active areas are annealed by laser before depositing an isolation layer. This laser anneal activation step lowers the resistivity of the polycrystalline Si. However, the active area near the gate pattern is not activated due to the laser scattering, resulting in a high resistivity area. High resistivity in an LDD may cause a transistor malfunction. FIG. 4 shows this scattering effect due to the gate pattern in the LDD area. During laser annealing of source, drain (211, 213) and LDD (215) area, laser is scattered at the gate pattern edge (410). A certain area within the distance from the gate pattern, which is an LDD area near channel may not be activated, causing a transistor malfunction. This problem can be solved by an additional step, which comprises forming mask patterns (710, 720, 730) smaller than gate patterns (410, 420, 430), etching the gate patterns and laser annealing LDD area as shown in FIG. 5b. The LDD area can be activated by laser annealing because the LDD area is now away from the scattering region.

Figure 6A:
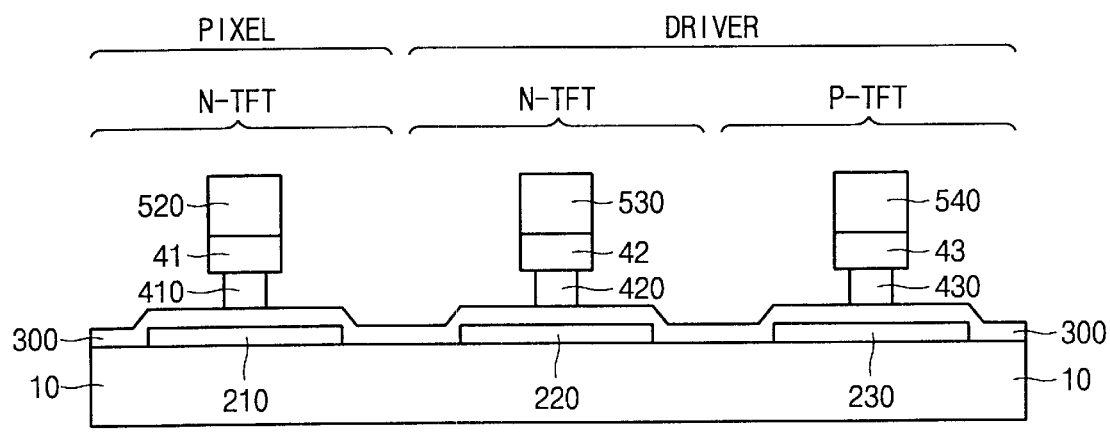
FIGS. 6a through 6e illustrate process sequences of a third embodiment of second aspect of the present invention.
Figure 6B:
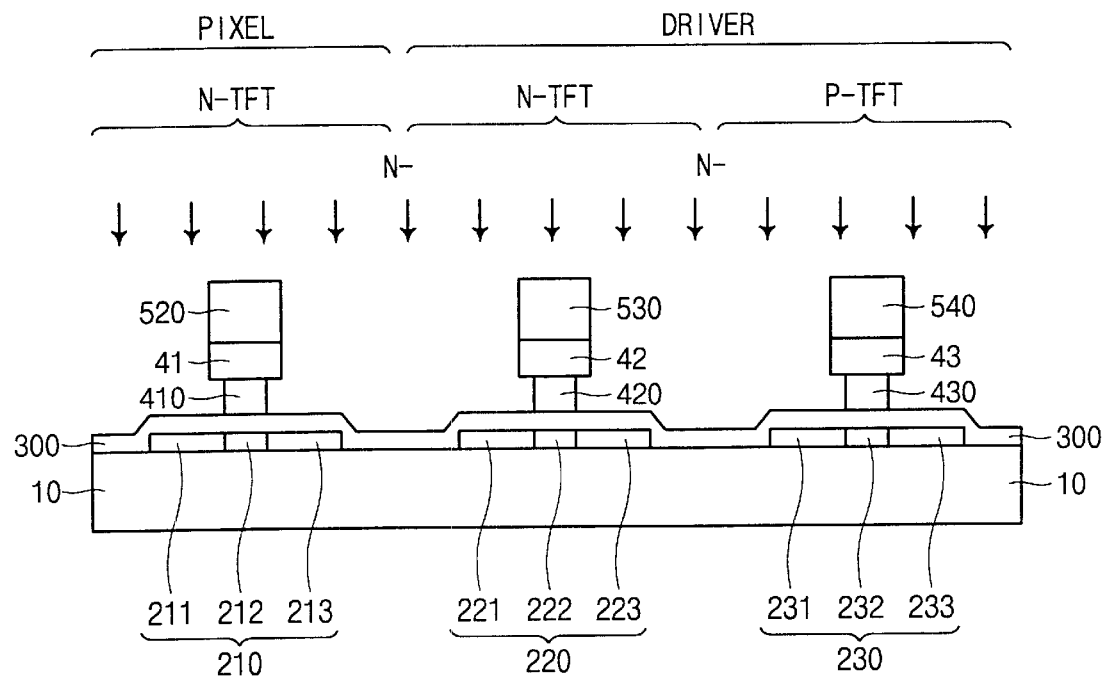

FIGS. 6a~6e show sequences of vertical section showing a third embodiment of the present invention. As illustrated in FIGS. 6a and 6b, photoresist patterns (520, 530, 540) are formed in the TFT active area (FIG. 6a) to form a gate pattern. Gate patterns are formed (41;42;43, 410;420;430) using photoresist patterns as etch mask. Lower gate patterns are narrower than upper gate patterns and have undercuts.

Figure 6C:
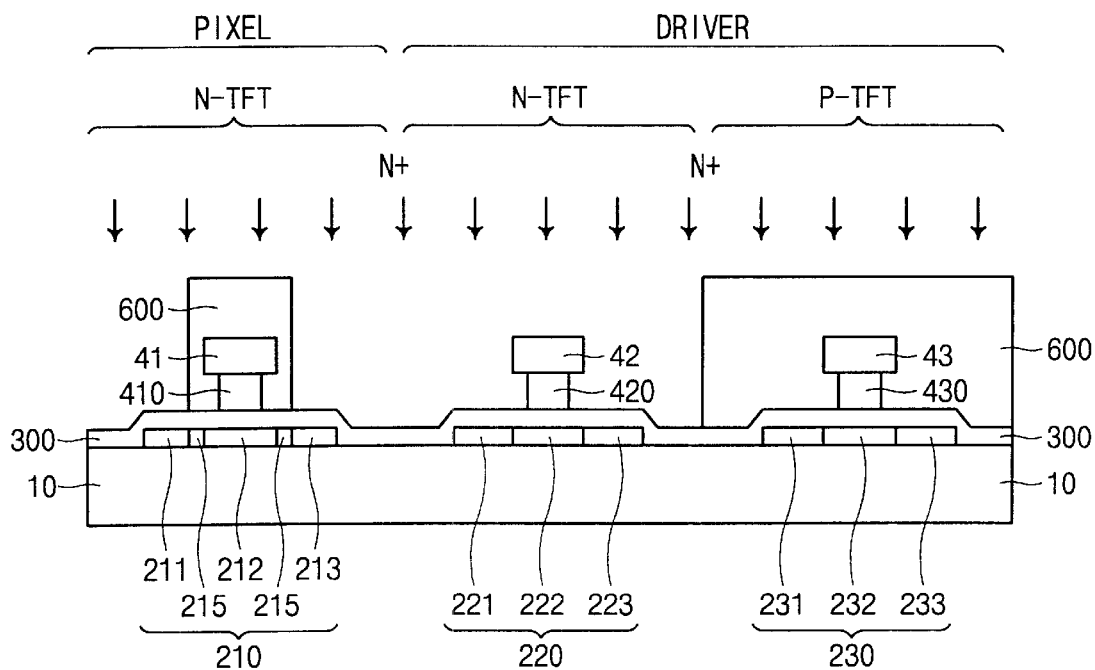
Figure 6D:
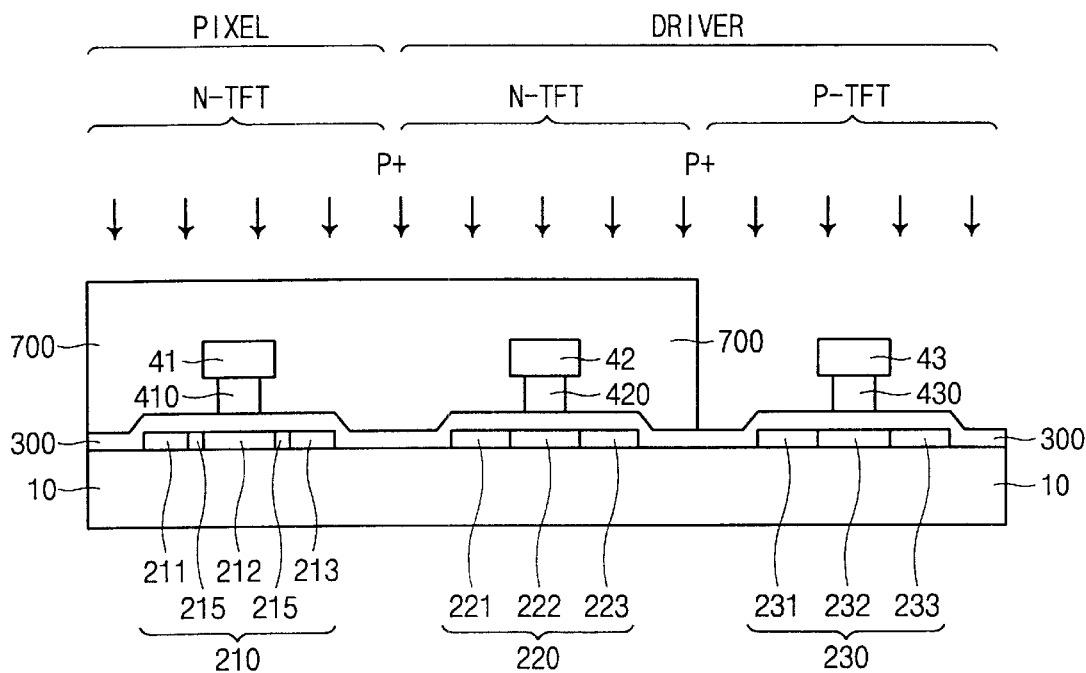
Figure 6E:
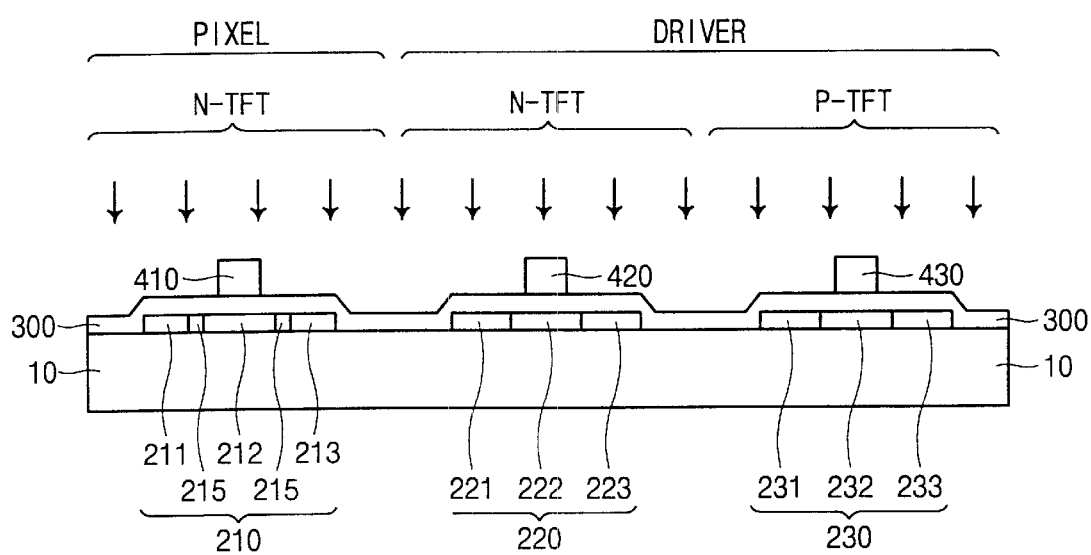
Figure 7A:
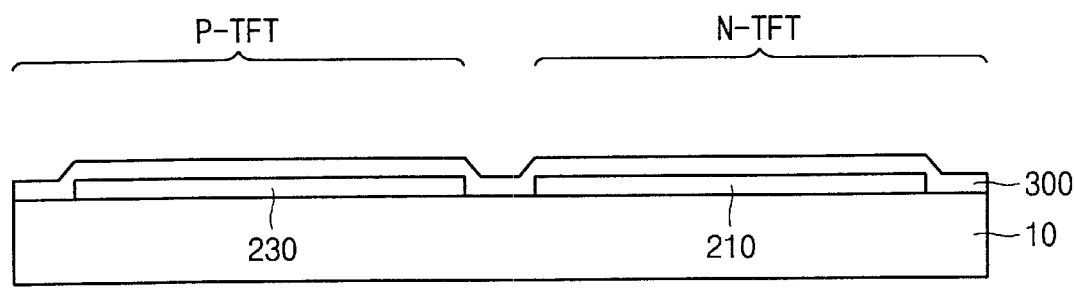
FIGS. 7a through 7e illustrate process sequences of a fourth embodiment of the present invention.
Figure 7B:
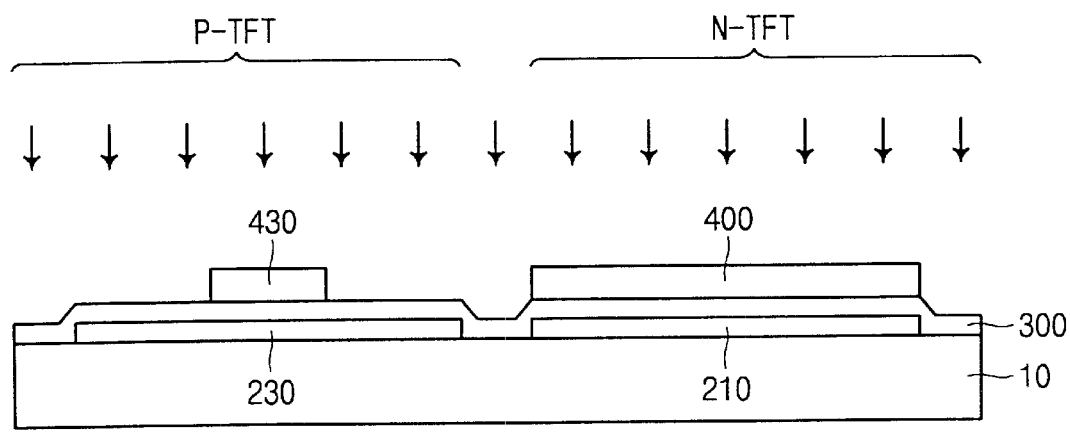
Figure 7C:
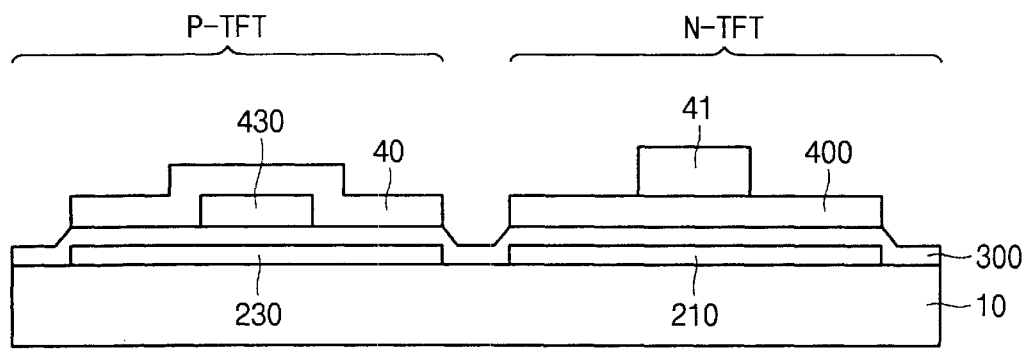
Figure 7D:
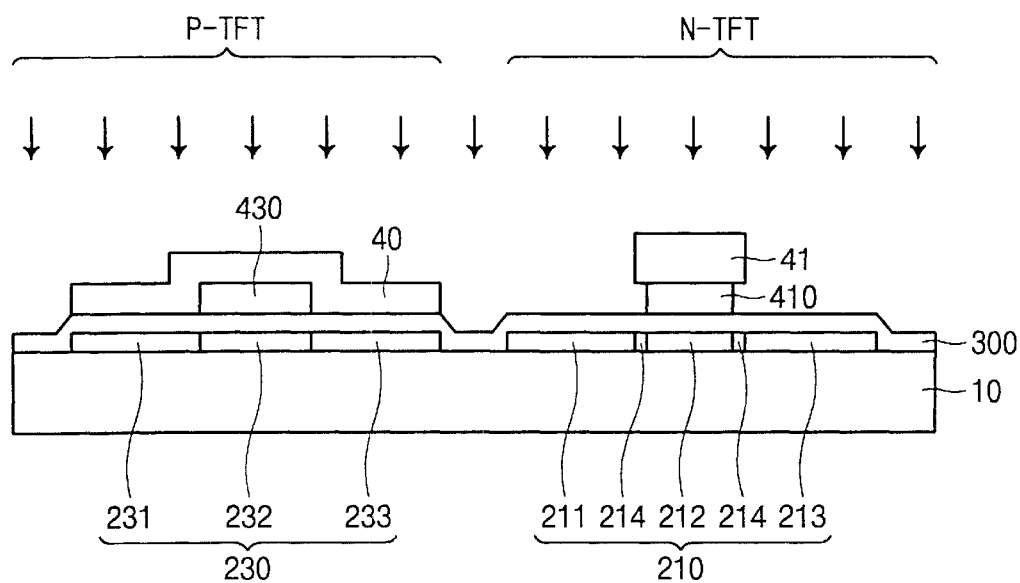
Figure 7E:
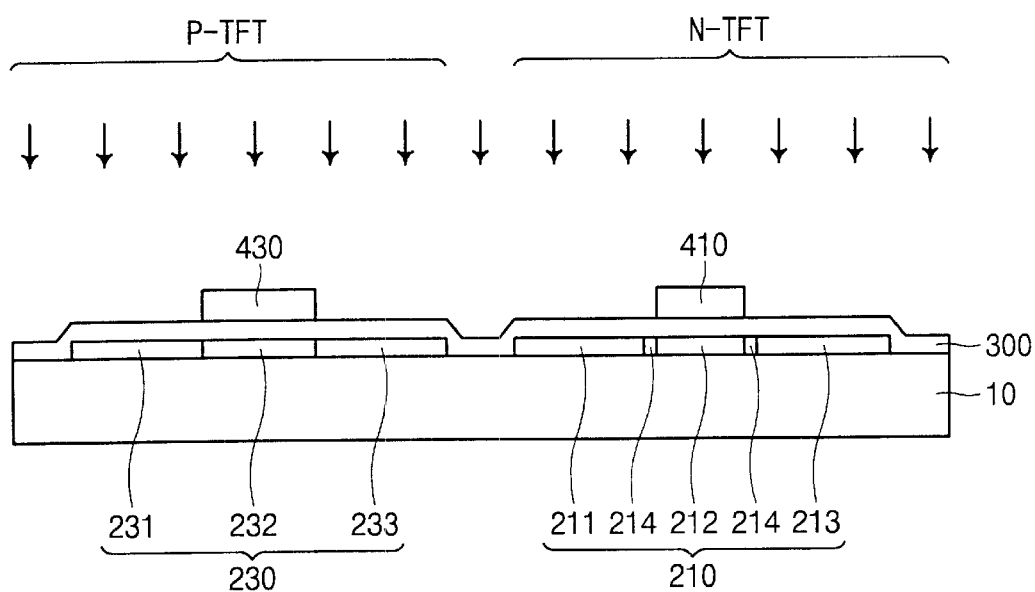

The process continues with a low energy implantation of N-type impurity as shown in FIG. 6b. Active areas (211, 213, 221, 223, 231, 233) that are not masked by the upper gate pattern are implanted and active areas (212, 222, 232) under upper gate pattern are not implanted. After removing photoresist patterns, a new photo resist pattern (600) is formed over a P-type TFT of the driver circuit and over a gate (41, 410) of the N-type TFT in the pixel circuit. The gate photoresist pattern overlying the gate electrode (41, 410) in the pixel circuit should be wider than the channel area (212) in the active area (210) because it will be used in forming an LDD (215) area. Source and drain (211; 221, 213; 223) are formed by a high energy implantation of N-type impurity using the photoresist pattern (600) as implantation mask as shown in FIG. 6c. An LDD area is formed between channel (212) and source (or drain) (211, 213) in the N-type TFT of pixel circuit because a wider photoresist pattern protects the ion implantation over the LDD area (215). A New photoresist pattern (700) is formed after removing the old photoresist pattern (600) as shown in FIG. 6d. The photoresist pattern is formed to expose the P-type TFT area in the driver circuit. Source and drain (231, 233) are formed in an active area (230) by implanting P-type impurity and the upper gate patterns (41, 42, 43) is etched out after removing the photoresist pattern (700). The following laser annealing activates the implanted ions in the active area. Following processes of deposition of insulation layer, forming source and drain electrodes, passivation and pixel electrode completes the TFT structure on the lower substrate of the LCD.

FIGS. 7a~7e show a sequence of vertical section of a fourth embodiment of the present invention. First, active areas (210, 230) and a gate insulation layer are formed on a glass substrate (10). The active area is formed by crystallizing the amorphous Si layer through laser annealing, followed by a photolithography process. A buffer layer can be formed also on the glass substrate as an insulation layer. Lower gate patterns (400, 430) are formed on the N-channel TFT area and on the gate area in the P-channel TFT and then, P-type impurity is implanted using the lower gate pattern (400, 430) as implant mask. Upper gate pattern (40, 41) is formed over the P-channel TFT area and the gate area in the N-channel TFT by etching the upper gate layer in FIG. 7c.

As a result, the lower gate pattern (430) is wrapped by the upper gate layer (40) in the P-channel TFT area and the upper gate pattern (41) is formed over the lower gate pattern (400) that covers the whole N-channel TFT area.

The process continues with gate formation by etching the lower gate pattern using the upper gate pattern as etch mask and the N-type impurity is implanted. As a result, source (213), drain (211) channel (212) and gate (410) are formed. Off-set area (214) between the channel and the source, drain area is not implanted. The lower gate pattern covered by the upper gate pattern in the P-channel TFT is protected from etching and the active area in the P-channel TFT is also protected against the N-type impurity.

The lower gate pattern of the N-channel TFT forms an undercut by an isotropic etching using the upper gate pattern as etch mask. This is a self-alignment step, eliminating an extra photo step for the off-set area and a possible misalignment problem. After removing the upper gate pattern, low energy N-type impurities are implanted, making the offset area (214) in FIG. 7d an LDD area (214) in FIG. 7e.

According to the present invention, barrier structures like an off-set area and an LDD area can be easily formed in the polycrystalline Si type TFT by using a double gate layer process and isotropic undercut characteristics, enabling pixel circuits and driver circuits to be formed on the same substrate in minimum process steps. Especially according to the fourth embodiment, an extra implant mask is not needed, so we can decrease the process steps and can eliminate additional problems that may happen during the additional implantation step.

We claim:

1. A method for forming an N-channel TFT and a P-channel TFT on the same substrate of an LCD, comprising the steps of:

forming a Si layer on a glass substrate;

forming an active area by patterning the Si layer;

forming a gate insulation layer overlying the active area;

forming a lower metallic gate layer and an upper gate layer overlying the gate insulation layer;

forming a first photoresist pattern overlying a gate area of the N-channel TFT and the whole P-channel TFT area;

forming an upper gate pattern and a lower gate pattern that has an undercut in the lower gate pattern for the N-channel TFT at both source side and drain side using the first photoresist pattern as etch mask;

implanting N-type impurities using the upper gate pattern as implant mask;

removing the upper gate pattern;

forming a second photoresist pattern overlying the entire N-channel TFT area and the gate area of the P-channel TFT;

forming a gate pattern for the P-channel TFT using the second photoresist pattern as etch mask;

implanting P-type impurities using the second photoresist pattern as implant mask.

2. A method of claim 1, further comprising:

forming an LDD area by implanting low energy N-type impurities after said step of removing the upper gate pattern.

3. A method of claim 1, further comprising:

partially removing the photoresist pattern to be narrower than the lower gate pattern before said step of implanting P-type impurities.

4. A method of claim 1, further comprising:

forming a third photoresist pattern on the lower gate pattern, said third photoresist pattern being narrower than the lower gate pattern; etching the lower gate pattern using the third photoresist pattern; activating the impurity implanted area by laser annealing.

5. A method for forming a P-channel TFT and an N-channel TFT on the same substrate of an LCD, comprising the steps of:

forming a Si layer;

forming an active area by patterning the Si layer;

forming a gate insulation layer over the active area;

forming a lower gate layer overlying the gate insulating layer;

forming a lower gate pattern overlying the entire N-channel TFT area and the gate area of the P-channel TFT by a photolithography process;

implanting P-type impurities using the lower gate pattern as implant mask;

forming an upper gate pattern overlying the whole P-channel TFT area and the gate area of the N-channel TFT by a photolithography process;

etching the lower gate pattern in the N-channel TFT area using the upper gate pattern as etch mask;

implanting N-type impurities using the upper gate pattern as implant mask; and removing the upper gate pattern.

6. A method of claim 5, further comprising:

implanting low energy N-type impurities after removing the upper gate pattern.

7. A method of claim 5, wherein the etchant for the gate layer has a high selectivity against the lower gate material.

8. A method of claim 5, further comprising:

activating the implanted area by laser annealing.

9. A method of claim 6, further comprising:

activating the implanted area by laser annealing.

* * * * *